US009601490B2

(12) United States Patent
Zang et al.

(10) Patent No.: US 9,601,490 B2
(45) Date of Patent: Mar. 21, 2017

(54) FINFET WORK FUNCTION METAL FORMATION

(71) Applicant: GLOBALFOUNDRIES INC., Grand Cayman (KY)

(72) Inventors: Hui Zang, Albany, NY (US); Hoon Kim, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/040,953

(22) Filed: Feb. 10, 2016

(65) Prior Publication Data

US 2016/0163705 A1    Jun. 9, 2016

Related U.S. Application Data

(62) Division of application No. 13/944,403, filed on Jul. 17, 2013, now Pat. No. 9,293,333.

(51) Int. Cl.
| | |
|---|---|
| *H01L 27/092* | (2006.01) |
| *H01L 21/28* | (2006.01) |
| *H01L 29/49* | (2006.01) |
| *H01L 29/66* | (2006.01) |

(52) U.S. Cl.
CPC .... *H01L 27/0922* (2013.01); *H01L 21/28088* (2013.01); *H01L 27/0924* (2013.01); *H01L 29/4966* (2013.01); *H01L 29/66545* (2013.01); *H01L 29/66795* (2013.01)

(58) Field of Classification Search
CPC ............. H01L 27/0922; H01L 27/0924; H01L 29/66545; H01L 21/28088; H01L 29/4966; H01L 29/66795
USPC ......................................................... 257/369
See application file for complete search history.

(56) References Cited

U.S. PATENT DOCUMENTS

| | | | | |
|---|---|---|---|---|
| 2011/0198699 A1* | 8/2011 | Hung | ...................... | H01L 27/11 257/369 |
| 2012/0313178 A1* | 12/2012 | Liao | .................. | H01L 29/66545 257/368 |
| 2014/0110778 A1* | 4/2014 | Fumitake | ................ | H01L 29/78 257/330 |
| 2014/0327055 A1* | 11/2014 | Wang | .................. | H01L 29/4966 257/288 |

* cited by examiner

*Primary Examiner* — Fernando L Toledo
*Assistant Examiner* — Adam S Bowen
(74) *Attorney, Agent, or Firm* — Williams Morgan, P.C.

(57) ABSTRACT

An improved method and structure for fabrication of replacement metal gate (RMG) field effect transistors is disclosed. P-type field effect transistor (PFET) gate cavities are protected while N work function metals are deposited in N-type field effect transistor (NFET) gate cavities.

8 Claims, 12 Drawing Sheets

FINFET WORK FUNCTION METAL FORMATION

CROSS-REFERENCE TO RELATED APPLICATIONS

This application is a Divisional of co-pending application Ser. No. 13/944,403 filed Jul. 17, 2013.

FIELD OF THE INVENTION

The present invention relates generally to semiconductor fabrication and, more particularly, to formation of work function metals in transistors.

BACKGROUND

In a conventional metal oxide semiconductor field effect transistor (MOSFET), the source, channel, and drain structures are constructed adjacent to each other within the same plane. Typically, a gate dielectric is formed on the channel area and a gate electrode is deposited on the gate dielectric. The transistor is controlled by applying a voltage to the gate electrode, thereby allowing a current to flow through the channel between source and drain.

An alternative to methods of building planar MOSFETs involves the construction of three-dimensional MOSFETs, in the form of a multi-gate transistor such as a dual-gate field effect transistor (FinFET) or a tri-gate transistor field effect transistor, as a replacement for the conventional planar MOSFET.

Three-dimensional transistor designs such as the FinFET and the tri-gate field effect transistor allow tighter packing of the same number of transistors on a semiconductor chip by using vertical or angled surfaces for the gates.

The gate electrode is commonly formed on the gate dielectric using a doped polysilicon layer, one or more metal layers, or a combination of polysilicon and metal layers. The gate electrode may be capped with a dielectric layer to mask and protect the structure during front-end processing. The width of the gate electrode structure and regions of isolation between the gate electrodes is commonly miniaturized to provide a greater density of gates per unit area. Deviations in the gate structure may lead to reduced device performance or operational failure of one or more transistors.

SUMMARY

In a first aspect, embodiments of the present invention provide a semiconductor structure comprising an N-type field effect transistor comprising a gate, wherein the gate comprises: a lower portion and an upper portion, wherein the lower portion comprises a bottom and interior sidewalls, and wherein the upper portion comprises interior sidewalls; an N work function metal disposed along the bottom of the lower portion and interior sidewalls; a P work function metal disposed on the N work function metal and along the interior sidewalls of the upper portion; and a fill metal disposed on the P work function metal.

In a second aspect, embodiments of the present invention provide a method of forming a semiconductor structure comprising an N-type field effect transistor (NFET) and a P-type field effect transistor (PFET), comprising: forming an NFET polysilicon gate; forming a PFET polysilicon gate; forming a mask layer over the PFET polysilicon gate; removing the NFET polysilicon gate to form an NFET gate cavity; depositing an N work function metal on an interior surface of the NFET gate cavity; recessing the N work function metal; removing the mask layer and PFET polysilicon gate to form a PFET gate cavity; depositing a P work function metal on an interior surface of the PFET gate cavity; and depositing a fill metal in the NFET gate cavity and PFET gate cavity.

In a third aspect, embodiments of the present invention provide a method of forming a semiconductor structure comprising an N-type field effect transistor (NFET) and a P-type field effect transistor (PFET), comprising: forming an NFET polysilicon gate; forming a PFET polysilicon gate; forming a first mask layer over the PFET polysilicon gate; removing the NFET polysilicon gate to form an NFET gate cavity; depositing an N work function metal on an interior surface of the NFET gate cavity; recessing the N work function metal; forming a second mask layer over the NFET polysilicon gate; removing the first mask layer and the PFET polysilicon gate to form a PFET gate cavity; removing the second mask layer; depositing a P work function metal on an interior surface of the PFET gate cavity; and depositing a fill metal in the NFET gate cavity and PFET gate cavity.

BRIEF DESCRIPTION OF THE DRAWINGS

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity. Furthermore, for clarity, some reference numbers may be omitted in certain drawings.

Often, similar elements may be referred to by similar numbers in various figures (FIGs) of the drawing, in which case typically the last two significant digits may be the same, the most significant digit being the number of the drawing figure (FIG.).

Figure 1:
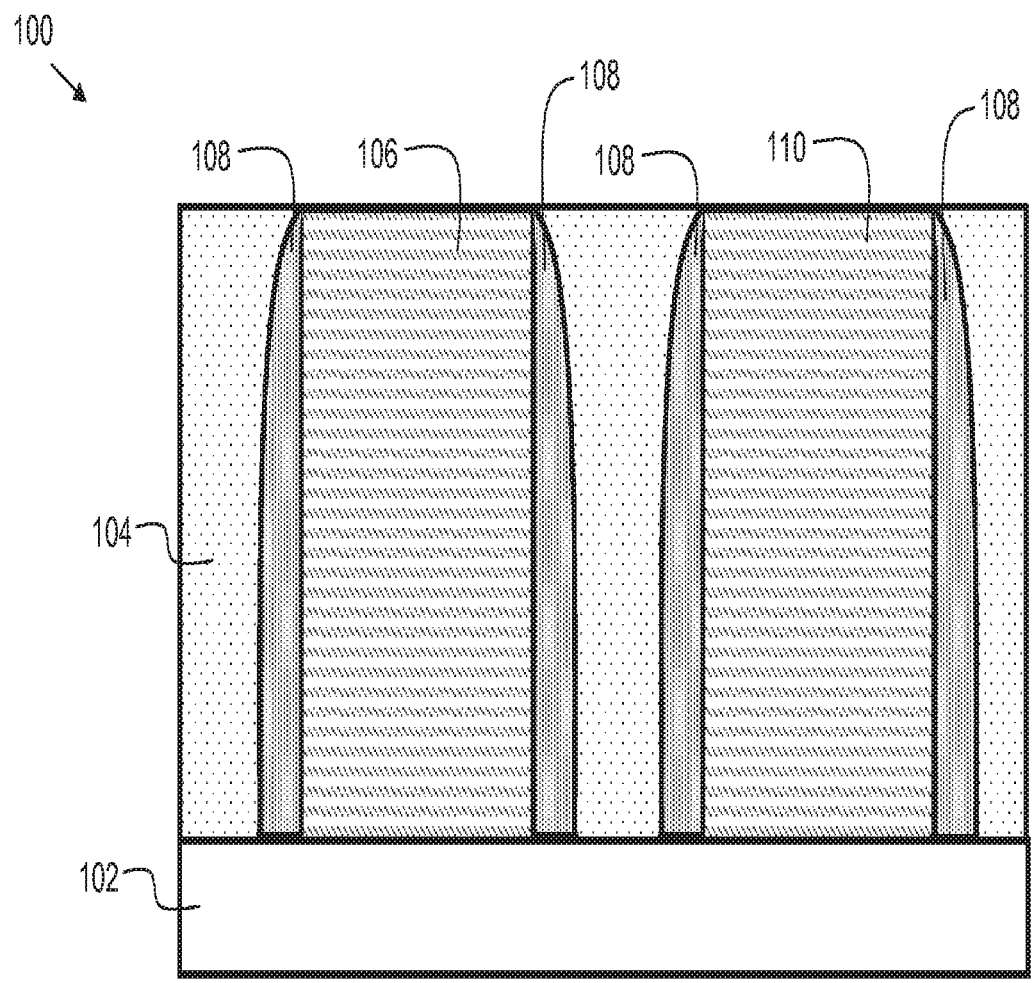
Figure 2:
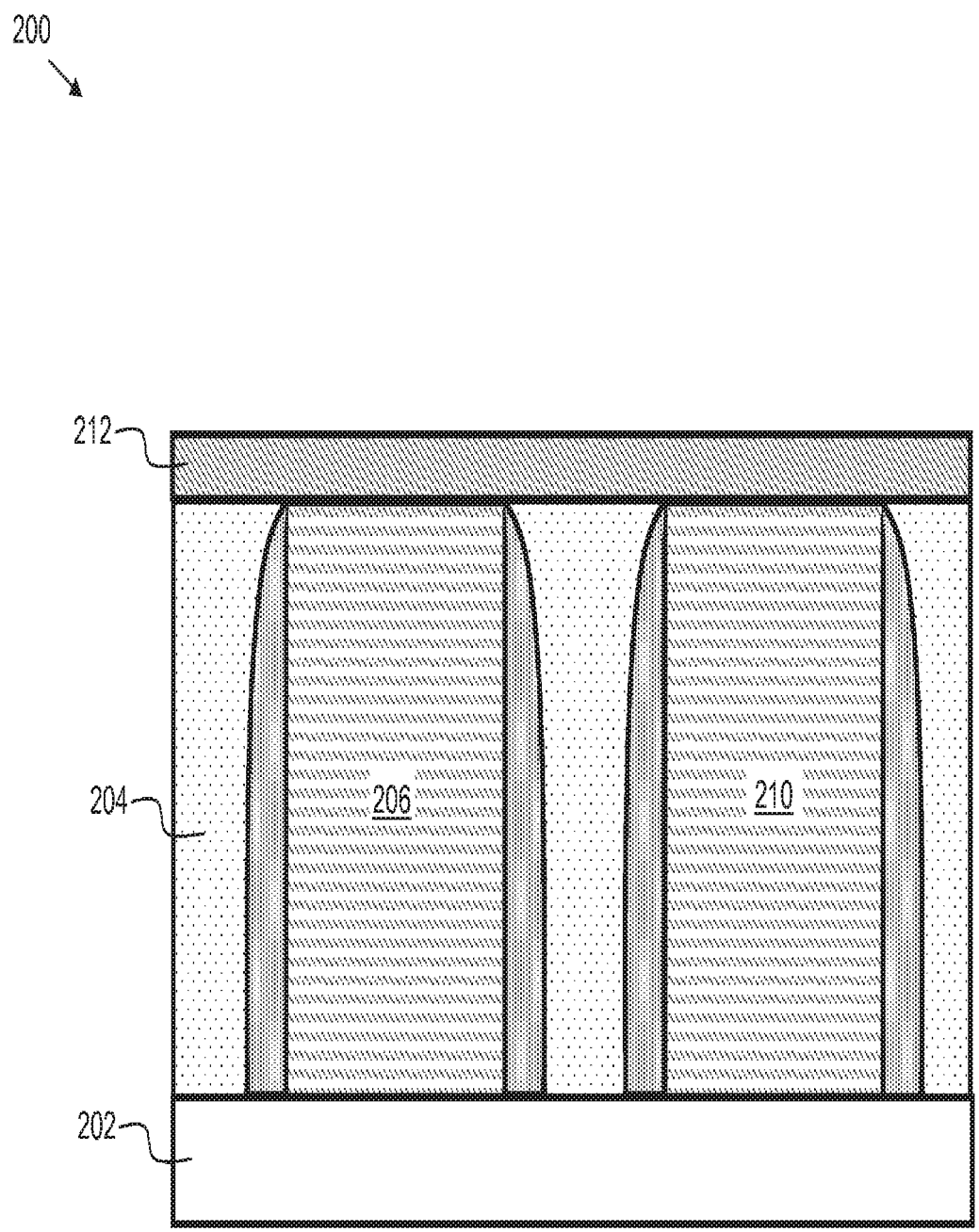
Figure 3:
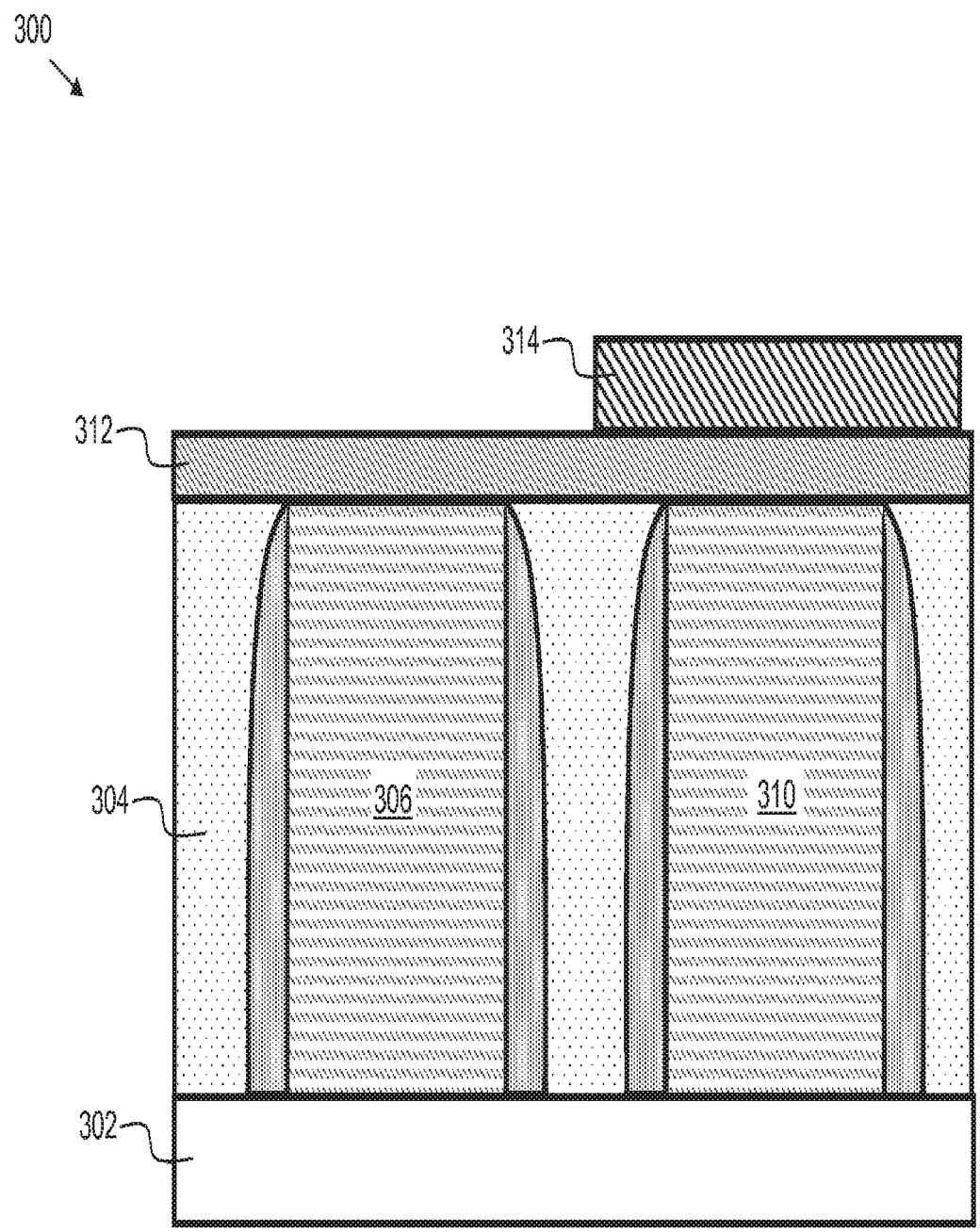
Figure 4:
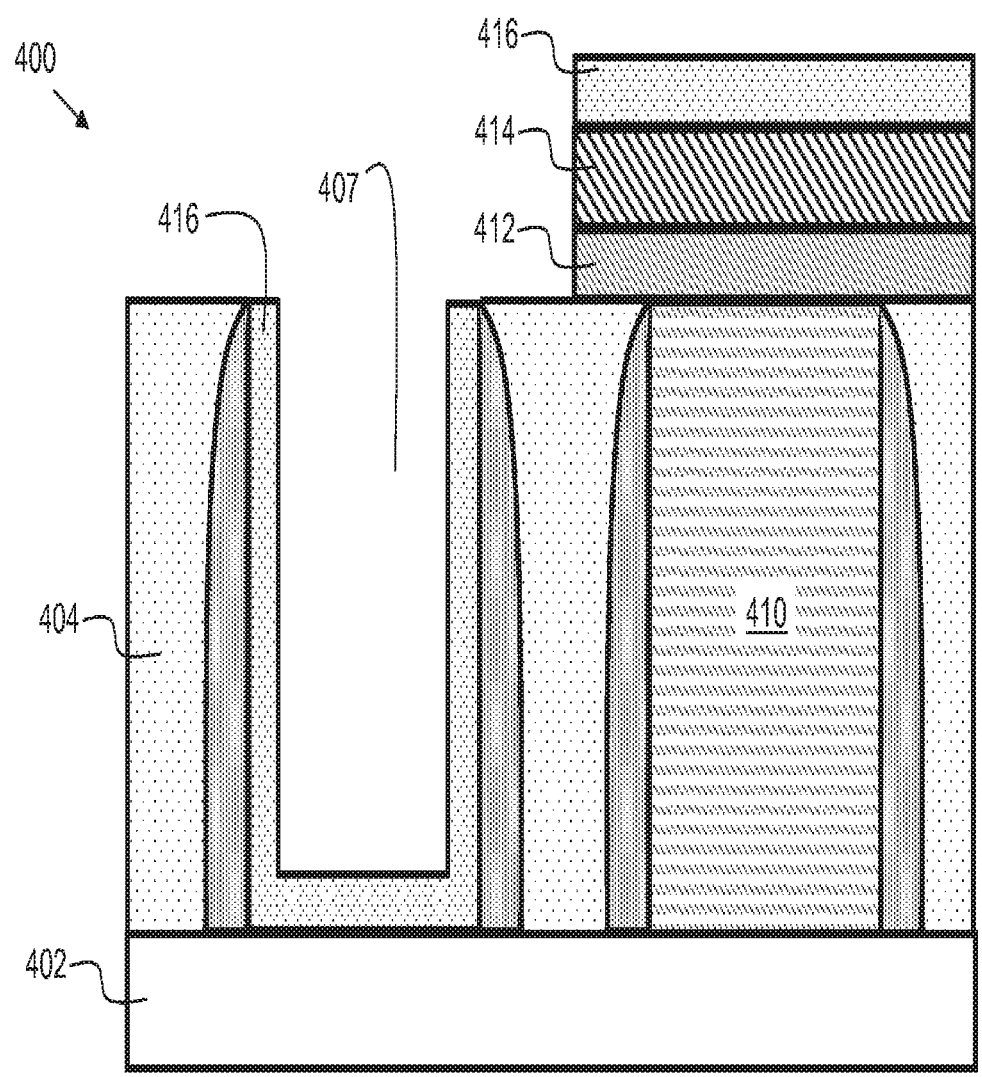
Figure 5:
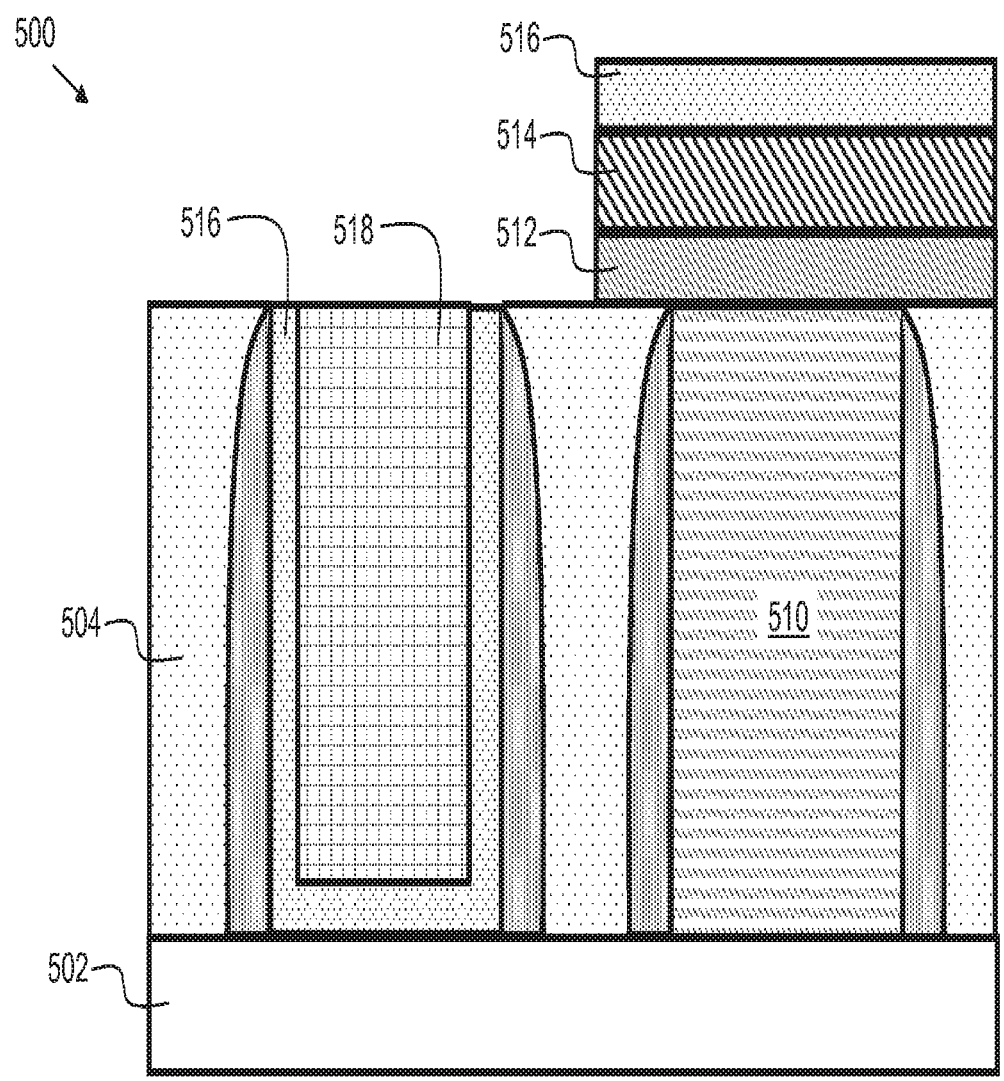
Figure 6:
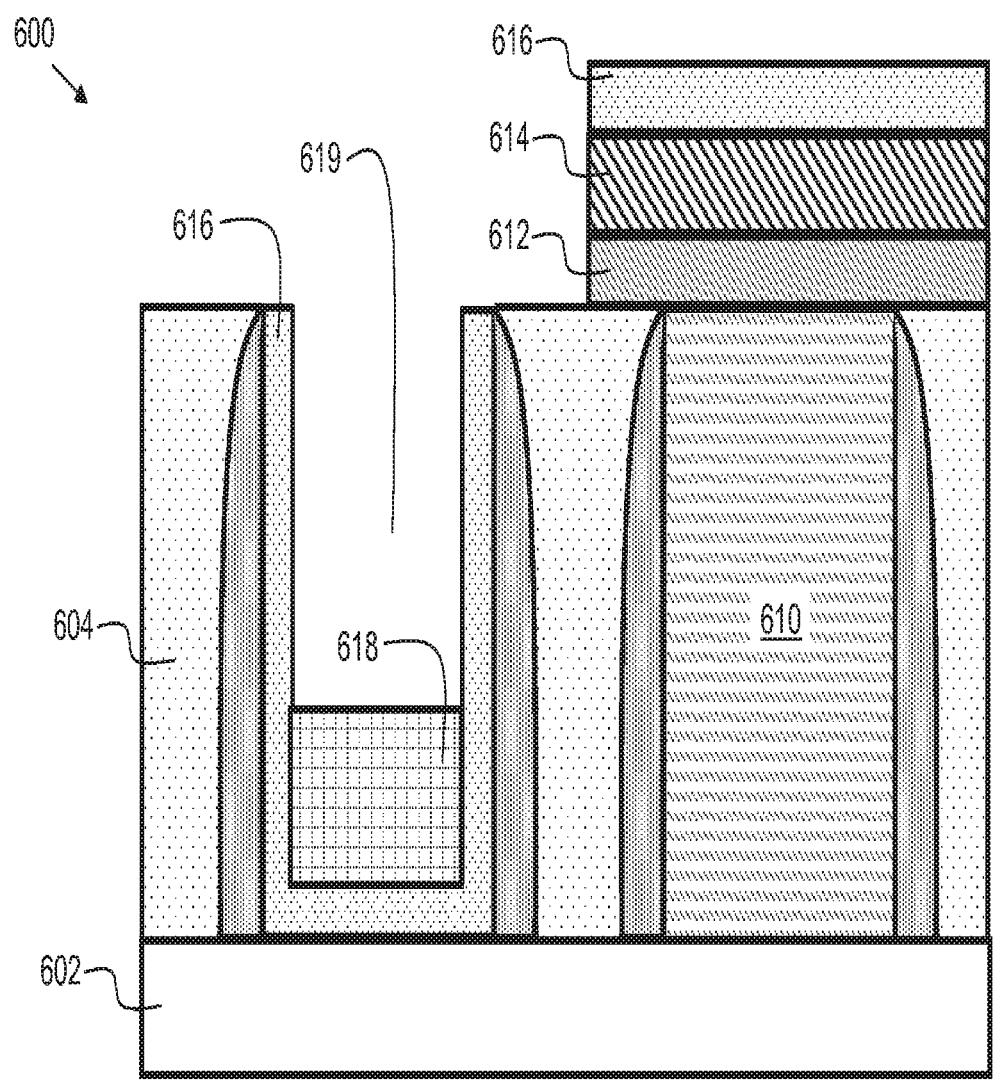
Figure 7:
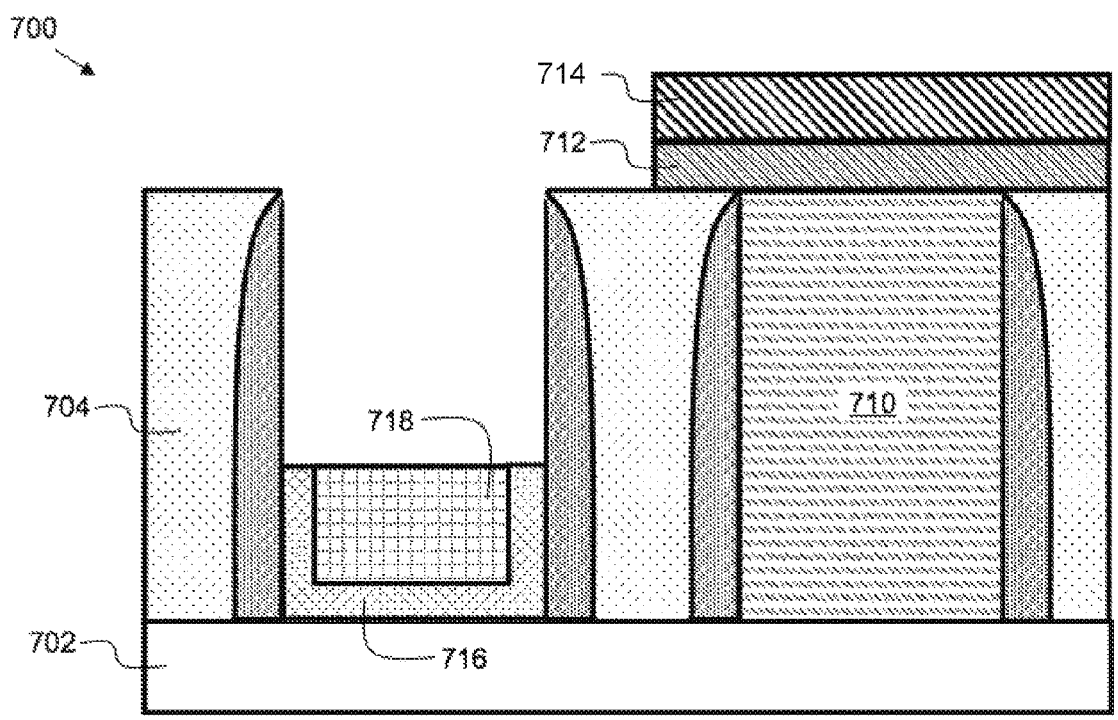
Figure 8:
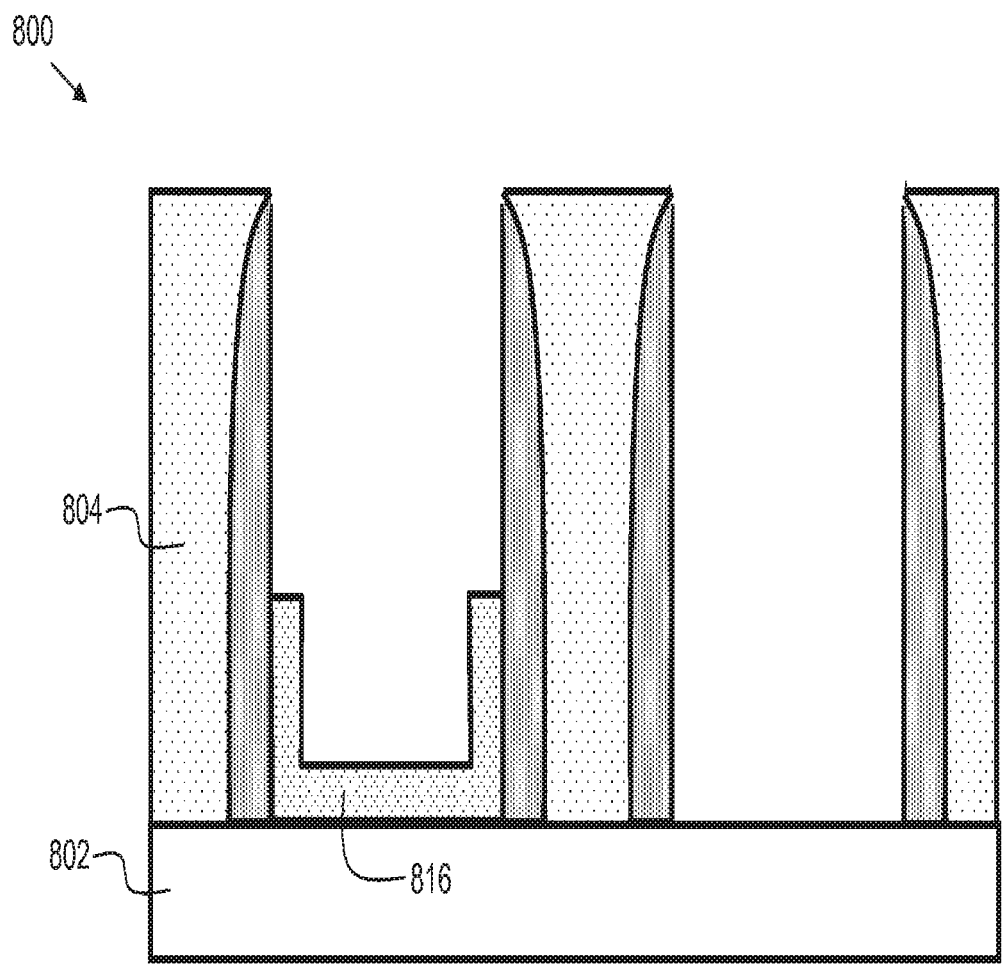
Figure 9:
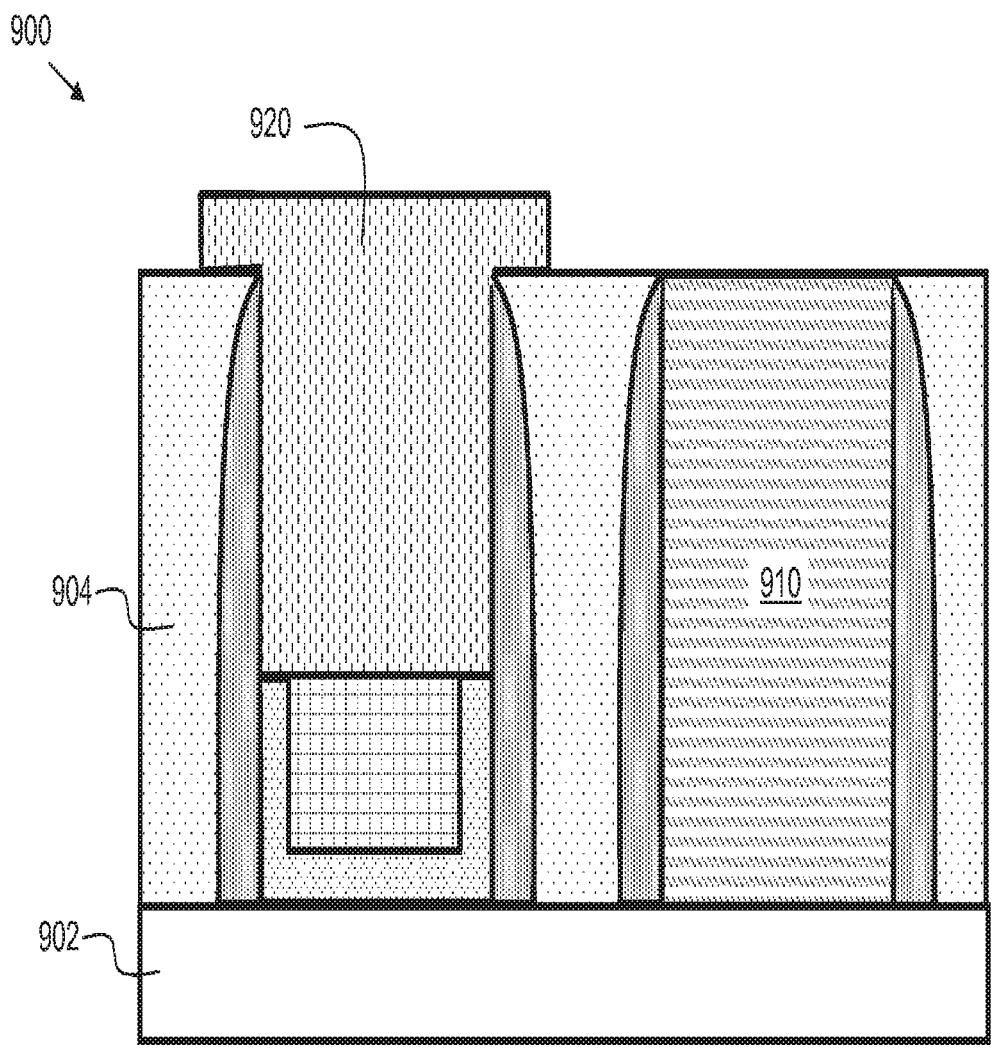
Figure 10:
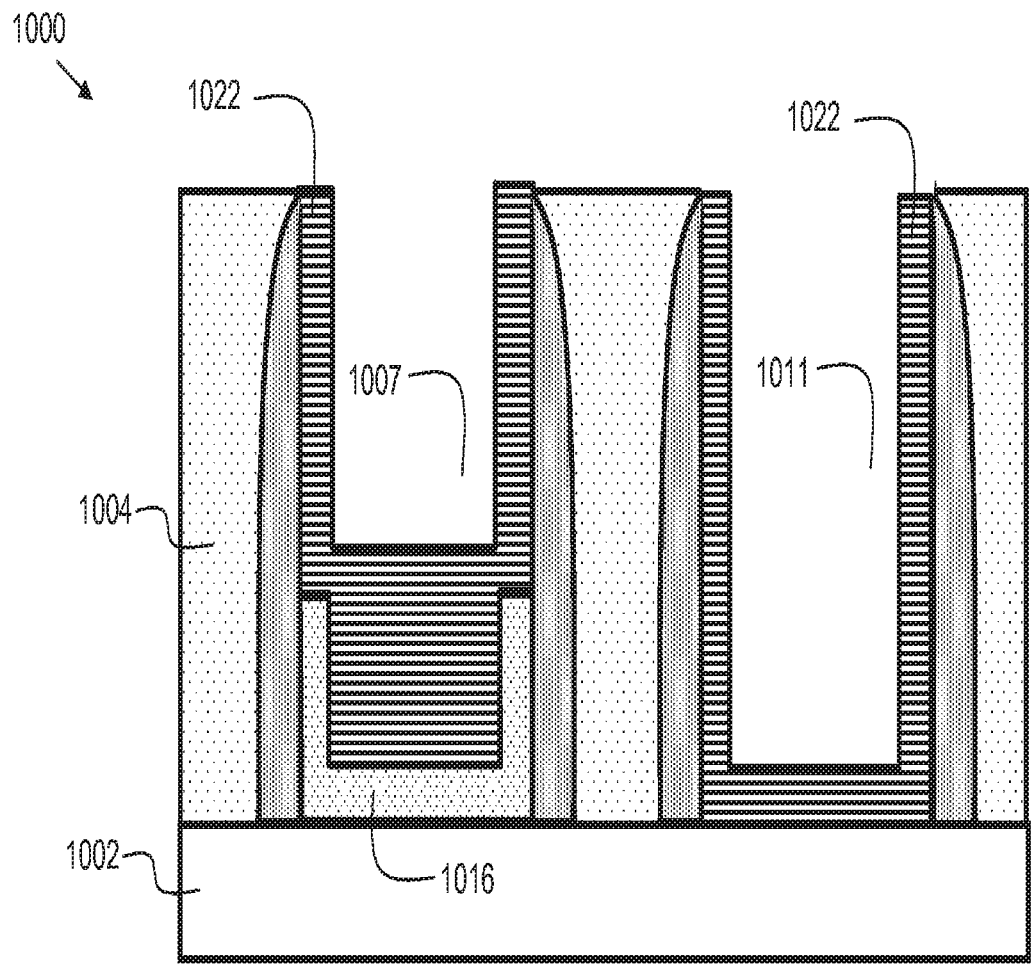
Figure 11:
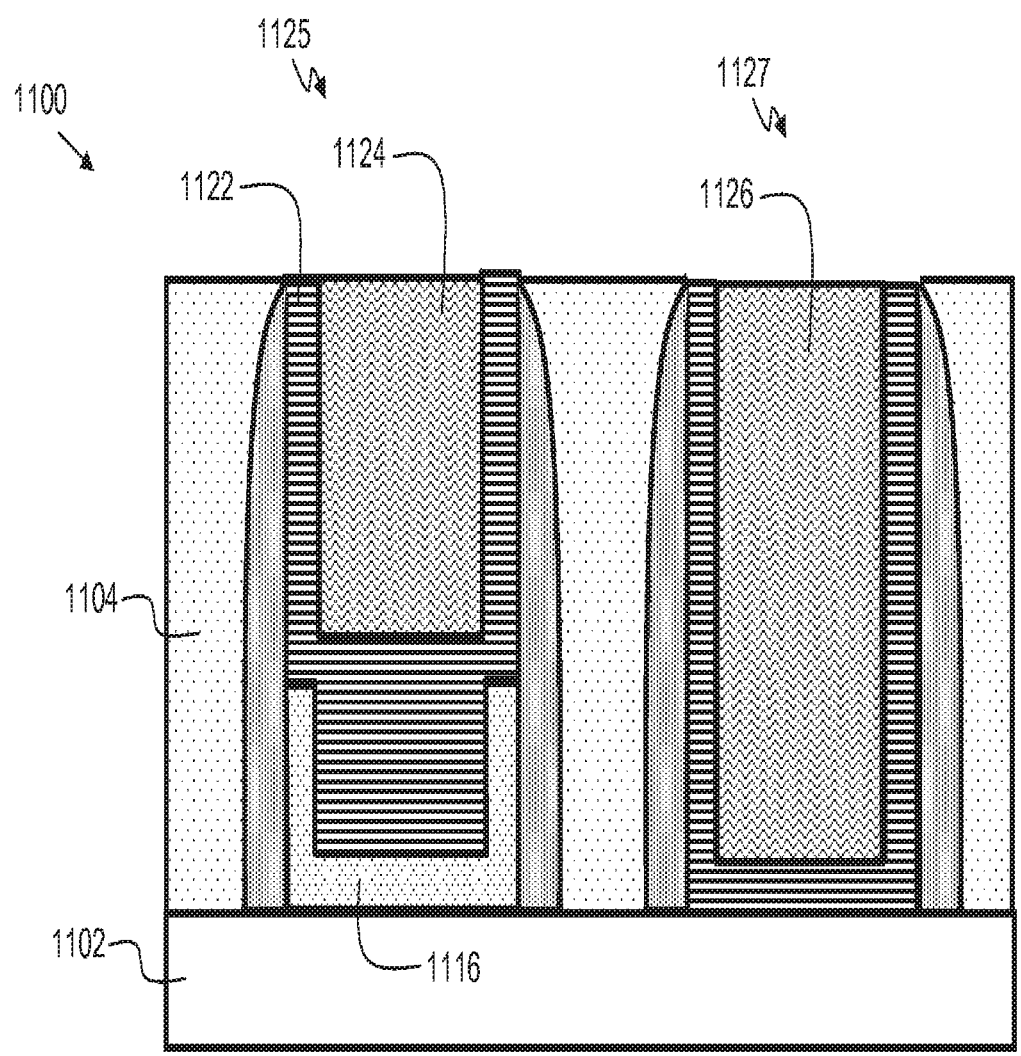
Figure 12:
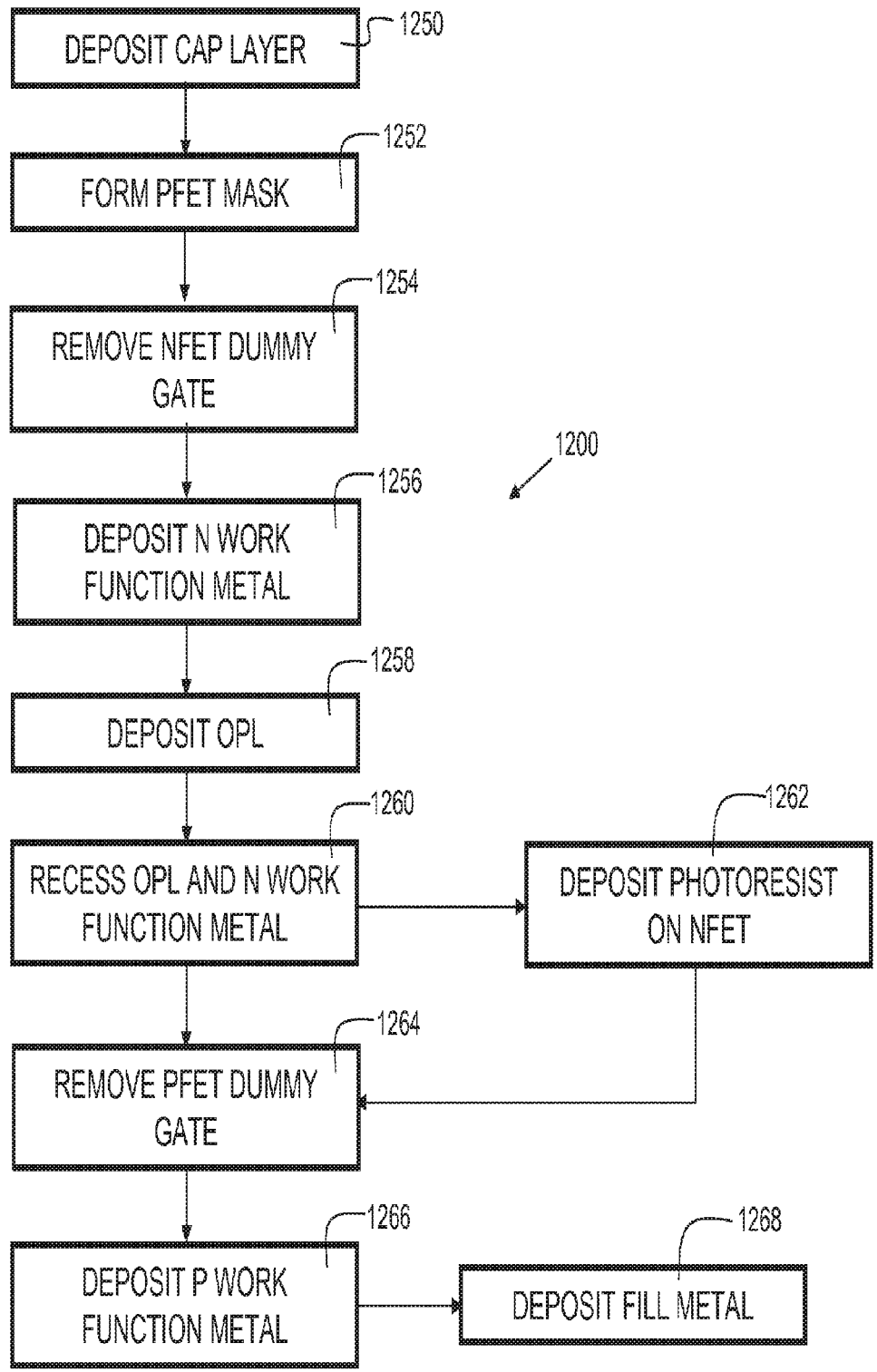

Features of this invention will be more readily understood from the following detailed description of the various aspects of the invention taken in conjunction with the accompanying drawings in which:

FIG. 1 shows a semiconductor structure at a starting point for illustrative embodiments;

FIG. 2 shows a semiconductor structure after a subsequent process step of depositing a silicon oxide cap layer in accordance with illustrative embodiments;

FIG. 3 shows a semiconductor structure after a subsequent process step of forming a PFET mask in accordance with illustrative embodiments;

FIG. 4 shows a semiconductor structure after subsequent process steps of removing a dummy NFET gate and depositing an N work function metal in accordance with illustrative embodiments;

FIG. 5 shows a semiconductor structure after a subsequent process step of depositing an organic planarization layer in accordance with illustrative embodiments;

FIG. 6 shows a semiconductor structure after a subsequent process step of recessing the organic planarization layer in accordance with illustrative embodiments;

FIG. 7 shows a semiconductor structure after a subsequent process step of recessing the N work function metal in accordance with illustrative embodiments;

FIG. 8 shows a semiconductor structure after subsequent process steps of removing the PFET dummy gate and organic planarization layer in accordance with illustrative embodiments;

FIG. 9 shows a semiconductor structure after a subsequent process step of depositing photoresist on the NFET in accordance with alternative illustrative embodiments;

FIG. 10 shows a semiconductor structure after a subsequent process step of depositing the P work function metal in accordance with illustrative embodiments;

FIG. 11 shows a semiconductor structure after a subsequent process step of depositing a fill metal in accordance with illustrative embodiments; and FIG. 12 is a flowchart indicating process steps for illustrative embodiments.

DETAILED DESCRIPTION

Exemplary embodiments will now be described more fully herein with reference to the accompanying drawings, in which exemplary embodiments are shown. Embodiments of the present invention provide an improved method and structure for fabrication of replacement metal gate (RMG) field effect transistors. P-type field effect transistor (PFET) gate cavities are protected while N work function metals are deposited in N-type field effect transistor (NFET) gate cavities. This prevents damage that can be incurred when removing N work function metals from PFET gate cavities, thus improving device yield and reliability.

It will be appreciated that this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art. The terminology used herein is for the purpose of describing particular embodiments only and is not intended to be limiting of this disclosure. For example, as used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure (e.g., a first layer), is present on a second element, such as a second structure (e.g. a second layer), wherein intervening elements, such as an interface structure (e.g. interface layer), may be present between the first element and the second element.

FIG. 1 shows a semiconductor structure 100 at a starting point for illustrative embodiments. Structure 100 includes semiconductor substrate 102, which may be a silicon substrate, such as a bulk silicon substrate or silicon-on-insulator (SOI) substrate. A dielectric layer 104 is disposed on substrate 102. The dielectric layer 104 may be formed of oxide. An N type field effect transistor (NFET) dummy gate 106 is formed on structure 100. Similarly, a P type field effect transistor (PFET) dummy gate 110 is formed on structure 100. Gate 106 and gate 110 may be comprised of polysilicon. Spacers 108 may be disposed adjacent to each dummy gate. In embodiments, the spacers may be comprised of nitride, or multiple layers of nitride and oxide.

FIG. 2 shows a semiconductor structure 200 after a subsequent process step of depositing a silicon oxide cap layer 212 in accordance with illustrative embodiments. As stated previously, similar elements may be referred to by similar numbers in various figures (FIGs) of the drawing, in which case typically the last two significant digits may be the same. For example, substrate 202 of FIG. 2 is similar to substrate 102 of FIG. 1. In embodiments, the silicon oxide cap layer 212 may be deposited via chemical vapor deposition (CVD), and may have a thickness ranging from about 5 nanometers to about 10 nanometers.

FIG. 3 shows a semiconductor 300 structure after a subsequent process step of forming a PFET mask 314 in accordance with illustrative embodiments. PFET mask 314 may be comprised of oxide, or may be a photoresist. The PFET mask 314 may be formed by standard patterning/lithographic techniques such that it covers the PFET dummy gate 310 but does not cover the NFET dummy gate 306.

FIG. 4 shows a semiconductor structure 400 after subsequent process steps of removing the dummy NFET gate (306 of FIG. 3) and depositing an N work function metal 416 in accordance with illustrative embodiments. The N work function metal 416 may be deposited via atomic layer deposition (ALD), chemical vapor deposition (CVD), or other suitable technique, and is deposited along the bottom and interior sidewalls of gate cavity 407. In some embodiments, the N work function metal may have a thickness ranging from about 5 angstroms to about 10 angstroms. In some embodiments, the N work function metal may include, but is not limited to, titanium carbide (TiC), titanium aluminide (TiAl), tantalum aluminide (TaAl3), hafnium aluminide (HfAl or HfAl3), or a metal silicide. During the deposition of the N work function metal 416, a portion of N work function metal 416 may also be deposited on PFET mask 414, and will be removed in a subsequent process step. The N work function metal is not deposited in the PFET gate area since PFET dummy gate 410 and layers 412 and 414 are present. Hence, the PFET gate area is not damaged by removal of the N work metal from the PFET gate area. Therefore, embodiments of the present invention reduce leakage currents due to damage of the high-K dielectric that may line the PFET gate area (not shown) and also reduce threshold voltage variation due to residue of the N work function metal. Thus, reliability of the PFET devices is improved.

FIG. 5 shows a semiconductor structure 500 after a subsequent process step of depositing an organic planarization layer (OPL) 518 in accordance with illustrative embodiments. In some embodiments, the OPL 518 may include a photo-sensitive organic polymer comprising a light-sensitive material that, when exposed to electromagnetic (EM) radiation, is chemically altered and thus configured to be removed using a developing solvent. For example, the photo-sensitive organic polymer may be polyacrylate resin, epoxy resin, phenol resin, polyamide resin, polyimide resin, unsaturated polyester resin, polyphenylenether resin, polyphenylenesulfide resin, or benzocyclobutene (BCB).

FIG. 6 shows a semiconductor structure after 600 a subsequent process step of recessing the organic planarization layer 618 in accordance with illustrative embodiments. OPL 618 is recessed to an intermediate level within the NFET gate cavity such that an upper portion 619 of the N gate region is exposed.

FIG. 7 shows a semiconductor structure 700 after a subsequent process step of recessing the N work function metal 716 in accordance with illustrative embodiments. The recessing may include using a chamfering process. The N work function metal over the PFET dummy gate 710 is removed during this process (compare with 616 of FIG. 6).

FIG. 8 shows a semiconductor structure 800 after subsequent process steps of removing the PFET dummy gate and organic planarization layer (OPL) in accordance with illustrative embodiments. The PFET dummy gate and OPL may be removed via wet etch processes.

FIG. 9 shows a semiconductor structure 900 after a subsequent process step of depositing photoresist 920 on the NFET in accordance with alternative illustrative embodiments. The photoresist 920 serves to protect the N gate region during removal of the PFET dummy gate 910.

FIG. 10 shows a semiconductor structure 1000 after a subsequent process step of depositing the P work function metal 1022 in accordance with illustrative embodiments. The P work function metal 1022 is deposited on the interior surfaces of PFET gate cavity 1011, and is also deposited within NFET gate cavity 1007. However, with the NFET gate cavity 1007, the P work function metal 1022 is nonfunctional, as the N work function metal 1016 is disposed at the base of the NFET gate cavity 1007.

FIG. 11 shows a semiconductor structure 1100 including NFET gate 1125 and PFET gate 1127 after a subsequent process step of depositing a fill metal 1124 and 1126 in accordance with illustrative embodiments. In some embodiments, the fill metal 1124 and/or 1126 may be made of tungsten. In other embodiments, aluminum or cobalt may be used, which serve as a low resistance metal. NFET gate 1125 includes N work function metal 1116 disposed along the bottom of the lower portion and interior sidewalls of the NFET gate cavity. P work function metal 1122 is disposed on the N work function metal, and along the interior sidewalls of the upper portion of the NFET gate cavity. Fill metal 1124 is disposed on the P work function metal 1122.

FIG. 12 is a flowchart 1200 indicating process steps for illustrative embodiments. In process step 1250, an oxide cap layer is deposited (see 212 of FIG. 2). In process step 1252, a PFET mask is formed (see 314 of FIG. 3). In process step 1254, the NFET dummy gate is removed (see 400 of FIG. 4). In process step 1256, an N work function metal is deposited (see 416 of FIG. 2). In process step 1258, an organic planarization layer is deposited (see 518 of FIG. 5). In process step 1260, the OPL and N work function metal are recessed (see 700 of FIG. 7). In optional process step 1262, a photoresist region is deposited over the NFET gate region to protect it during removal of the PFET dummy gate (see 920 of FIG. 9). In process step 1264, the PFET dummy gate is removed (see 800 of FIG. 8). In process step 1266, a P work function metal is deposited (see 1022 of FIG. 10). In process step 1268, a fill metal is deposited (see 1124 and 1126 of FIG. 11). From this point forward, industry standard techniques may be used to complete the fabrication of the transistors and integrated circuit.

While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A semiconductor structure comprising an N-type field effect transistor comprising a gate, wherein the gate comprises:
   a lower portion and an upper portion, wherein the lower portion comprises a bottom and interior sidewalls, and wherein the upper portion comprises interior sidewalls;
   an N work function metal disposed along the bottom and interior sidewalls of the lower portion;
   a P work function metal disposed on the N work function metal and along the interior sidewalls of the upper portion; and
   a fill metal disposed on the P work function metal.

2. The semiconductor structure of claim 1, further comprising a P-type field effect transistor (PFET) comprising a gate, wherein the gate comprises:
   a PFET gate cavity;
   a P work function metal disposed along a bottom of the gate and interior sidewalls of the PFET gate cavity; and
   the fill metal disposed in the PFET gate cavity.

3. The semiconductor structure of claim 1, wherein the N work function metal comprises titanium carbide.

4. The semiconductor structure of claim 1, wherein the N work function metal comprises titanium aluminide.

5. The semiconductor structure of claim 1, wherein the N work function metal comprises tantalum aluminide.

6. The semiconductor structure of claim 1, wherein the N work function metal comprises hafnium aluminide.

7. The semiconductor structure of claim 1, wherein the N work function metal has a thickness ranging from about 5 angstroms to about 10 angstroms.

8. The semiconductor structure of claim 1, wherein the fill metal comprises tungsten.

* * * * *